United States Patent
Su et al.

(10) Patent No.: US 9,666,691 B2
(45) Date of Patent: May 30, 2017

(54) EPITAXY PROFILE ENGINEERING FOR FINFETS

(75) Inventors: Chien-Chang Su, Kaohsiung (TW); Tsz-Mei Kwok, Hsin-Chu (TW); Hsien-Hsin Lin, Hsin-Chu (TW); Hsueh-Chang Sung, Zhubei (TW); Yi-Fang Pai, Hsin-Chu (TW); Kuan-Yu Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 241 days.

(21) Appl. No.: 13/608,961

(22) Filed: Sep. 10, 2012

(65) Prior Publication Data

US 2013/0001705 A1    Jan. 3, 2013

Related U.S. Application Data

(62) Division of application No. 12/713,573, filed on Feb. 26, 2010, now Pat. No. 8,263,451.

(51) Int. Cl.
| | | |
|---|---|---|
| *H01L 27/088* | (2006.01) | |
| *H01L 29/66* | (2006.01) | |
| *H01L 21/8234* | (2006.01) | |
| *H01L 21/8238* | (2006.01) | |
| *H01L 29/78* | (2006.01) | |
| *H01L 21/02* | (2006.01) | |

(52) U.S. Cl.
CPC ............ *H01L 29/66795* (2013.01); *H01L 21/823431* (2013.01); *H01L 21/823821* (2013.01); *H01L 29/785* (2013.01); *H01L 21/02532* (2013.01); *H01L 21/02636* (2013.01)

(58) Field of Classification Search
CPC ......... H01L 21/02532; H01L 21/02636; H01L 21/823431; H01L 21/823821; H01L 29/66795; H01L 29/785
See application file for complete search history.

(56) References Cited

U.S. PATENT DOCUMENTS

| | | | |
|---|---|---|---|
| 6,858,478 B2 * | 2/2005 | Chau et al. .......... | 438/149 |
| 7,148,526 B1 | 12/2006 | An et al. | |
| 2004/0145000 A1 | 7/2004 | An et al. | |
| 2005/0242395 A1 | 11/2005 | Chen et al. | |
| 2006/0046388 A1* | 3/2006 | Park et al. ........... | 438/257 |
| 2007/0075372 A1 | 4/2007 | Terashima et al. | |
| 2007/0205459 A1 | 9/2007 | Cho et al. | |
| 2007/0241399 A1 | 10/2007 | Irisawa et al. | |

(Continued)

FOREIGN PATENT DOCUMENTS

| | | |
|---|---|---|
| JP | 2007027725 A | 2/2007 |
| WO | WO 2005038931 A1 | 4/2005 |

*Primary Examiner* — Meiya Li
(74) *Attorney, Agent, or Firm* — Slater Matsil, LLP (57) ABSTRACT

A method of forming an integrated circuit structure includes providing a wafer including a substrate and a semiconductor fin at a major surface of the substrate, and performing a deposition step to epitaxially grow an epitaxy layer on a top surface and sidewalls of the semiconductor fin, wherein the epitaxy layer includes a semiconductor material. An etch step is then performed to remove a portion of the epitaxy layer, with a remaining portion of the epitaxy layer remaining on the top surface and the sidewalls of the semiconductor fin.

17 Claims, 6 Drawing Sheets

(56) References Cited

U.S. PATENT DOCUMENTS

| | | | |
|---|---|---|---|
| 2008/0003755 A1* | 1/2008 | Shah | H01L 29/66628 438/300 |
| 2008/0142891 A1 | 6/2008 | Booth et al. | |
| 2008/0230832 A1 | 9/2008 | Cho | |
| 2009/0026505 A1* | 1/2009 | Okano | H01L 29/66795 257/255 |
| 2009/0085027 A1* | 4/2009 | Jin et al. | 257/24 |

* cited by examiner

EPITAXY PROFILE ENGINEERING FOR FINFETS

PRIORITY CLAIM AND CROSS-REFERENCE

This application is a divisional of U.S. Patent application: application Ser. No. 12/713,573, filed Feb. 26, 2010, and entitled "Epitaxy Profile Engineering for FinFETs," which application is hereby incorporated herein by reference.

TECHNICAL FIELD

This disclosure relates generally to semiconductor devices, and more particularly to structures and formation methods of semiconductor fins and fin field-effect transistors (FinFETs).

BACKGROUND

With the increasing down scaling of integrated circuits and increasingly higher requirements for integrated circuits, transistors need to have higher drive currents with increasingly smaller dimensions. Fin field-effect transistors (FinFETs) were thus developed.

Similar to planar transistors, source and drain silicides may be formed on the source and drain regions of FinFETs. However, since the fins of FinFETs are typically narrow, current crowding may occur. In addition, it is difficult to land contact plugs onto the source/drain portions of fins. Epitaxy semiconductor layers are thus formed on the fins to increase their volumes using epitaxy processes.

Figure 1:
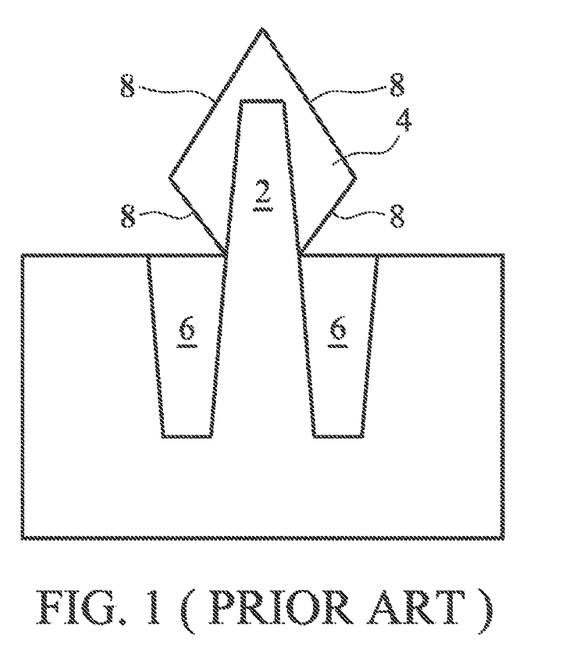
FIG. 1 illustrates a cross-sectional view of an epitaxy layer grown from a semiconductor fin.
Figure 2:
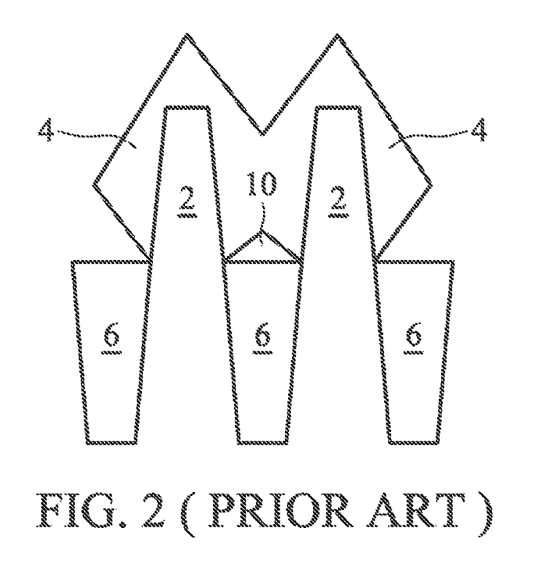
FIG. 2 illustrates the merging of the epitaxy layers grown from neighboring fins, wherein voids are generated when the epitaxy layers merge.

The epitaxial processes, however, suffer from drawbacks. FIG. 1 illustrates a cross-sectional view of a semiconductor structure including source/drain region 2 (which is part of the original fin) and epitaxy layer 4 epitaxially grown on source/drain region 2. In contrast to conventional planar devices, the volumes of source/drain regions 2 are not confined by shallow trench isolation (STI) regions 6. Since epitaxy layer 4 may have a growth rate smaller on (111) planes than on other planes, the outer surface of epitaxy layer 4 may not have a rectangular (or near-rectangular) profile as that of the original fin 2. Instead, epitaxy layer 4 may extend laterally and form facets 8. This may cause the excess reduction in the distance between epitaxy layers grown from neighboring fins. Accordingly, the merging window, in which the epitaxy layers growing from neighboring fins will not merge, is reduced. Further, even if the neighboring epitaxy layers 4 belong to a source/drain region of a same multi-fin FinFET, void 10 will be undesirably generated as a result of the merging of epitaxy layers 4 grown from neighboring fins 2, as shown in FIG. 2.

SUMMARY

In accordance with one aspect of the embodiment, a method of forming an integrated circuit structure includes providing a wafer including a substrate and a semiconductor fin at a major surface of the substrate, and performing a deposition step to epitaxially grow an epitaxy layer on a top surface and sidewalls of the semiconductor fin, wherein the epitaxy layer includes a semiconductor material. An etch step is then performed to remove a portion of the epitaxy layer, with a remaining portion of the epitaxy layer remaining on the top surface and the sidewalls of the semiconductor fin.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 3 through 8 are a perspective view and cross-sectional views of intermediate stages in the manufacturing of a FinFET in accordance with an embodiment.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts.

A novel fin field-effect transistor (FinFET) embodiment and the method of forming the same are presented. The intermediate stages of manufacturing the embodiment are illustrated. The variations of the embodiment are discussed. Throughout the various views and illustrative embodiments, like reference numbers are used to designate like elements.

Figure 3:
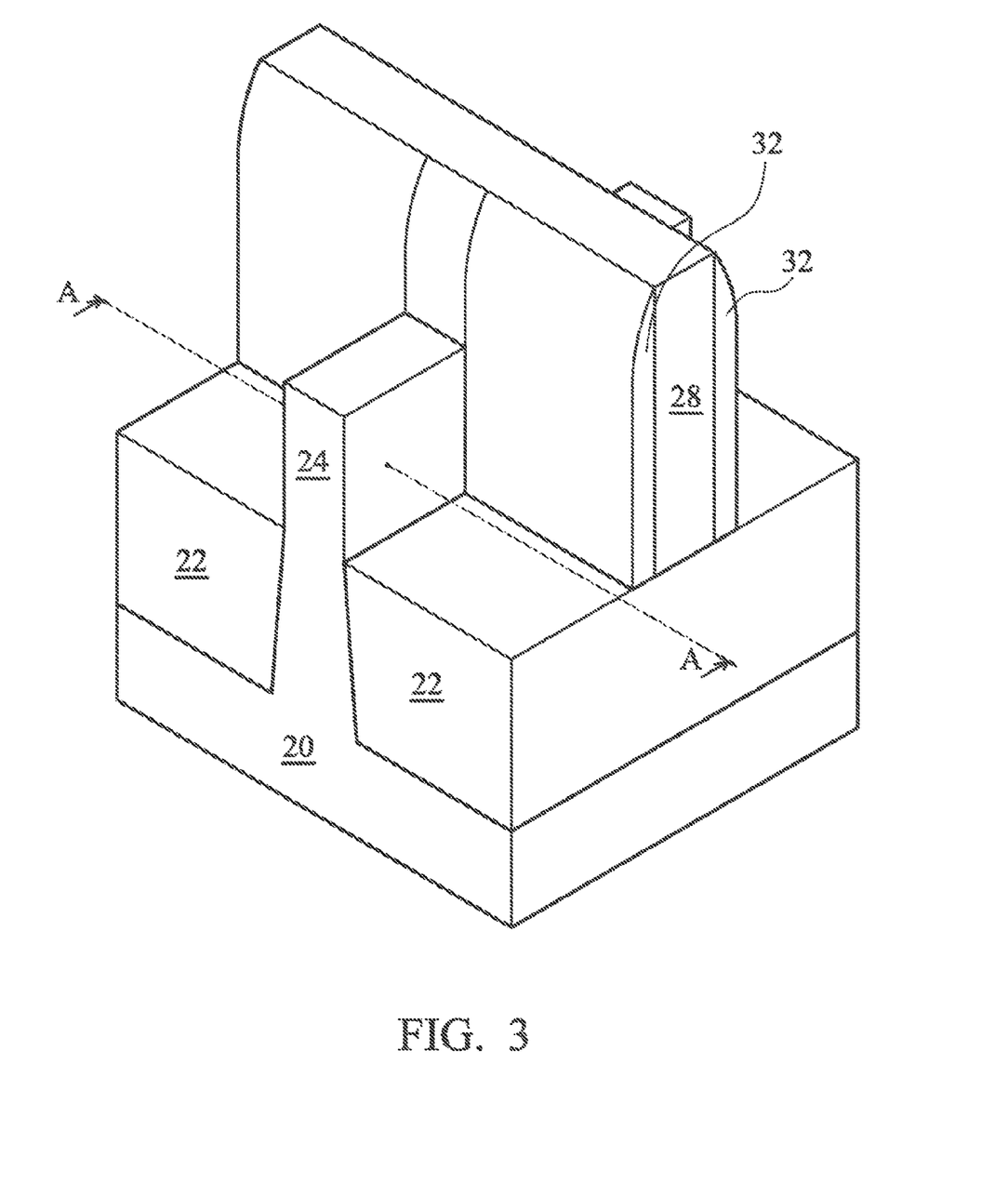

Referring to FIG. 3, an integrated circuit structure is formed. The integrated circuit structure includes substrate 20, which may be a bulk silicon substrate. Substrate 20 may be doped with a p-type or an n-type impurity. Isolation regions, such as shallow trench isolation (STI) regions 22 may be formed in substrate 20. Fin 24 is formed over top surfaces of STI regions 22. Fin 24 may be formed by removing top portions of STI regions 22, so that a portion of substrate 20 between neighboring STI regions 22 becomes a fin. Alternatively, fin 24 may be formed on top of substrate 20 by an epitaxial growth.

In an embodiment, substrate 20 has a surface orientation of (100), and fin 24 extends along the <110> direction. In other embodiments, substrate 20 may have other surface orientations such as (110), in which case fin 24 may extend in directions such as <100>. Gate dielectric 26 (not shown in FIG. 3, please refer to FIG. 4A), which may be formed of silicon oxide, high-k dielectric materials, or the like, is formed on the top surface and sidewalls of fin 24. Gate electrode 28 is formed on gate dielectric 26. Gate spacers 32 are formed on the sidewalls of gate electrode 28.

In the subsequent discussion, cross-sectional views are used to explain the concept of the embodiments. Unless specified otherwise, the cross-sectional views are obtained in vertical planes (referred to as source/drain planes hereinafter) crossing lines at the same position as line A-A in FIG. 3. It is noted that line A-A crosses the (would-be) source/drain region, but not gate electrode 28.

Figure 4A:
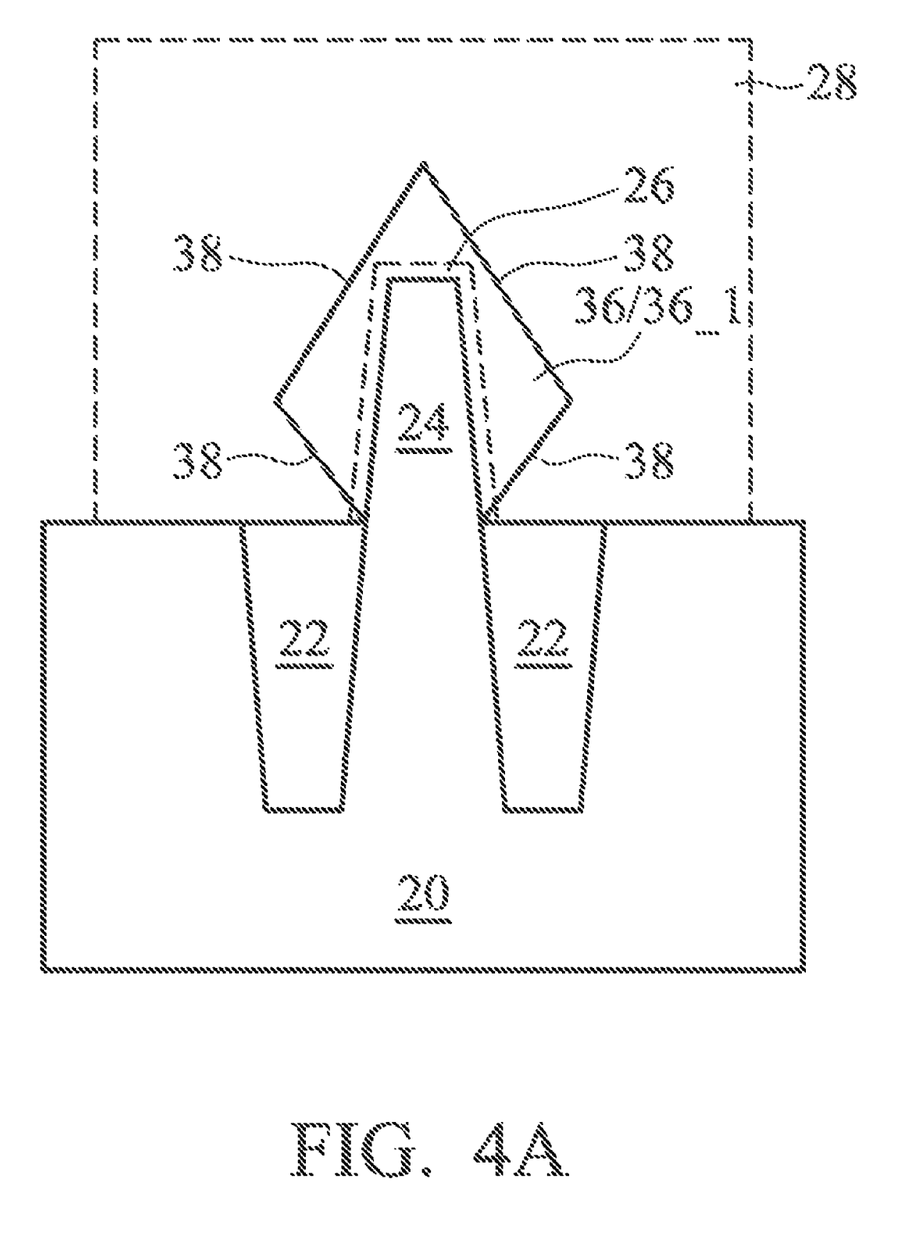

Next, as shown in FIG. 4A, epitaxy layer 36 is deposited, for example, epitaxially grown on the exposed portion of fin 24 by selective epitaxial growth (SEG). Epitaxy layer 36 (also referred to as epitaxy layer 36_1 hereinafter) may be formed of a semiconductor material same as, or a semiconductor material different from, that of fin 24. In an embodiment, epitaxy layer 36_1 is formed of substantially pure silicon. In alternative embodiments, epitaxy layer 36_1 may comprise silicon germanium (SiGe), silicon carbon (SiC), or the like. The formation methods of epitaxy layer 36_1 may include chemical vapor deposition (CVD), such as a reduced pressure CVD (RPCVD) or other applicable methods. Depending on the desirable composition of epitaxy layer 36_1, the precursors for the epitaxy may include Si-containing gases and Ge-containing gases, such as $SiH_4$ and $GeH_4$, and/or the like, and the partial pressures of the Si-containing gases and Ge-containing gases are adjusted to modify the atomic ratio of germanium to silicon. In an embodiment in which SiGe is desirable for forming epitaxy layer 36_1, the resulting epitaxy layer 36_1 includes greater than about 20 atomic percent germanium. The germanium percentage in epitaxy layer 36_1 may also be between about 20 percent and about 50 atomic percent.

FIG. 4A also illustrates gate dielectric 26 and gate electrode 28. Since gate dielectric 26 and gate electrode 28 are not in the source/drain plane, they are illustrated using dotted lines. For simplicity, in subsequent drawings, gate dielectric 26 and gate electrode 28 are not illustrated.

It is observed that due to different growth rates on different surface planes, facets may be formed. For example, the growth rate on surfaces having (111) surface orientations (referred to as (111) planes) is lower than that on other planes, such as (110) and (100) planes. Accordingly, facets 38 are formed as a result of the difference in the growth rates of different planes. If epitaxy layer 36_1 is grown freely, eventually, facts 38 will have the (111) surface orientations (in other word, on (111) planes). In the beginning of the epitaxial growth of epitaxy layer 36_1, facets 38 may not be fully established. However, with the proceeding of the epitaxial growth, due to the difference in growth rates, facets 38 are gradually formed.

Figure 4B:
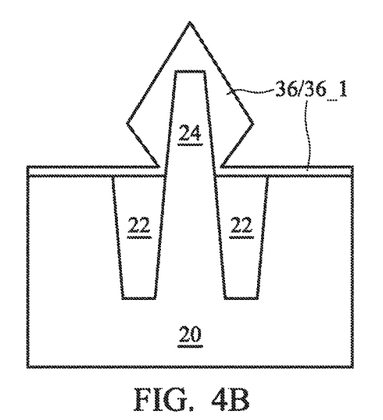

During the epitaxy process, etching gas, such as HCl gas, may be added (as an etching gas) into the process gas, so that epitaxy layer 36_1 is selectively grown on fin 24, but not on STI regions 22 and gate spacers 32 (not shown in FIG. 4A, please refer to FIG. 3). In alternative embodiments, no etching gas is added, or the amount of etching gas is small, so that there is a thin layer of epitaxy layer 36_1 formed on STI regions 22 and gate spacers 32, as shown in FIG. 4B. It is realized, however, that the portion of epitaxy layer 36_1 on STI regions 22 and gate spacers 32 may not have a crystalline structure.

Figure 5:
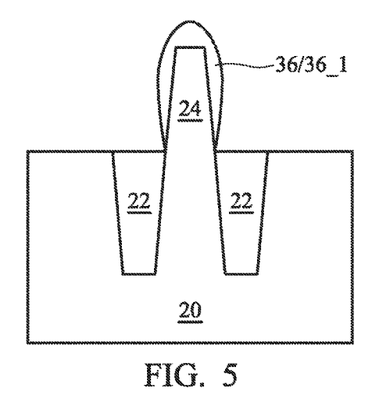

Referring to FIG. 5, after the formation of epitaxy layer 36_1, the epitaxial growth of epitaxy layer 36_1 is stopped, and an etch step is performed, for example, by introducing etching gases such as HCl into the same chamber as the deposition of epitaxy layer 36_1. In an embodiment, the epitaxial growth and the etch of epitaxy layer 36_1 are in-situ performed, that is, in a same process chamber with no vacuum break therebetween. The resulting structure is shown in FIG. 5. It is observed that during the etch step, the corners of epitaxy layer 36_1 are removed more than planar portions, and hence the surface profile of epitaxy layer 36_1 is rounded. In an exemplary embodiment, after the etch step, the resulting epitaxy layer 36_1 has an ellipse shape, with the outer surface of epitaxy layer 36_1 having a profile close to an egg shape. The etch step may include, for example, introducing either HCl or the combination of HCl and $GeH_4$ into the process chamber. The wafer temperature during the etch step may be greater than about 500° C. with both HCl and $GeH_4$ being introduced, or greater than about 700° C. with HCl, but no $GeH_4$, being introduced. During the etch step, plasma may or may not be activated.

Figure 6:
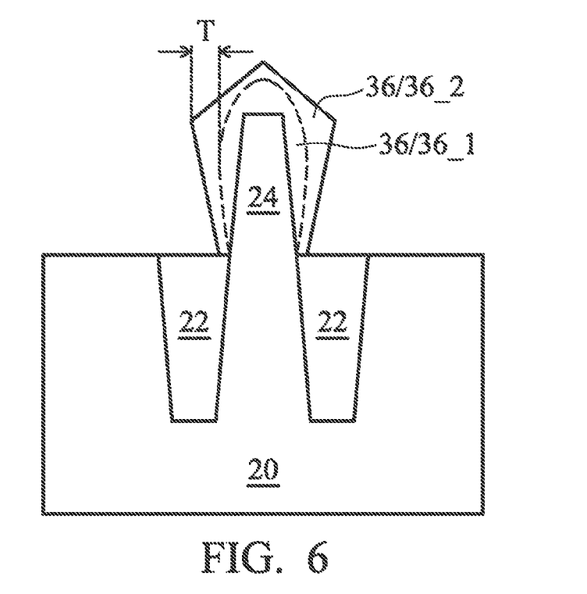
Figure 7:
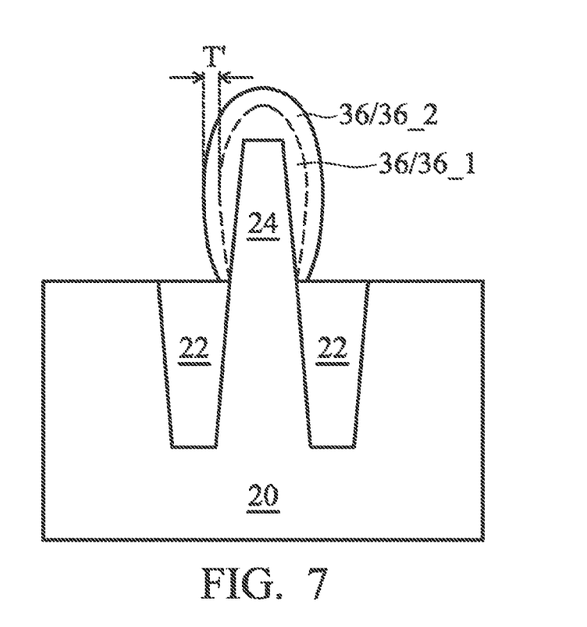

The deposition step and the etch step as discussed in the preceding paragraphs in combination are referred to as a deposition-etch cycle. In an embodiment, the formation of epitaxy layer 36 includes only one deposition-etch cycle. In alternative embodiments, after the first deposition-etch cycle, a second deposition step may be performed, which may further be followed by a second etch step, wherein the second deposition step and the second etch step are referred to as the second deposition-etch cycle. FIGS. 6 and 7 illustrate the structure resulted from the second deposition-etch cycle. In FIG. 6, epitaxy layer 36_2 is epitaxially grown on the remaining portion of epitaxy layer 36_1. Throughout the description, epitaxy layers 36_1 and 36_2 in combination are referred to as epitaxy layer 36. Epitaxy layer 36_2 may be formed of the same material as epitaxy layer 36_1, although they may also be formed of different semiconductor materials. Accordingly, the interface between epitaxy layers 36_1 and 36_2 is illustrated using a dashed line since it may not be visible. More deposition-etch cycles may be repeated to further increase the depth of epitaxy layer 36. The deposition-etch cycles may all be in-situ performed with no vacuum break therebetween. For each of the additional deposition-etch cycles, the thickness of epitaxy layer 36 is increased over the preceding deposition-etch cycle, and the profile of the resulting epitaxy layer 36 may be more conformal then if epitaxy layer 36 is formed by a single epitaxy step. Advantageously, by dividing one deposition-etch cycle into a plurality of deposition-etch cycles, the profile of epitaxy layer 36 may be more conformal.

With more portions of epitaxy layer 36 being etched, epitaxy layer 36 is more conformal. However, with a higher degree of etch back, the throughput is lower. In an embodiment, in the deposition step in each of the deposition-etch cycles, the thickness of the added portion of the epitaxy layer is denoted as T (refer to FIG. 6). After the etch step, the thickness of the added portion of epitaxy layer 36 is reduced to T' (refer to FIG. 7). The ratio of T'/T reflects the percentage of epitaxy layer 36 removed in the etch step. In an embodiment, ratio T'/T is greater than about 50 percent, and may be between about 50 percent and about 95 percent.

Figure 8:
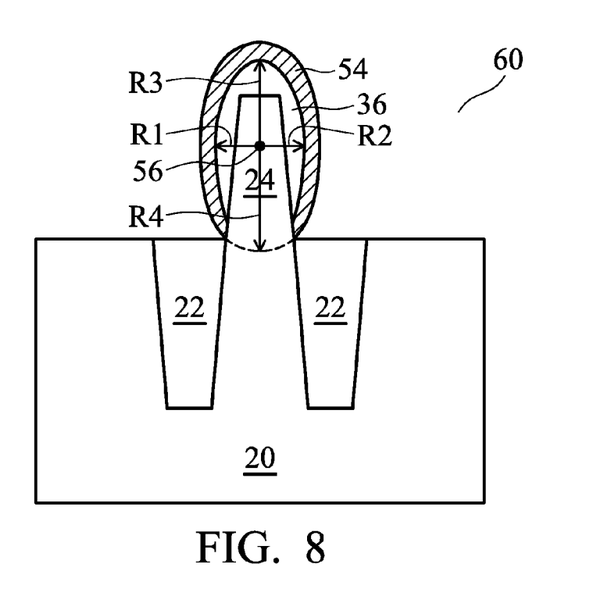

After the formation of epitaxy layer 36, a source/drain implantation is performed, so that epitaxy layer 36 becomes part of the source/drain region of the resulting FinFET 60. FIG. 8 illustrates the subsequent formation of silicide region (which may also be a germano-silicide region) 54. As is known in the art, silicide region 54 may be formed by blanket depositing a thin metal layer (not shown), such as nickel, platinum, palladium, vanadium, titanium, cobalt, tantalum, ytterbium, zirconium, and combinations thereof. The substrate is then heated, which causes silicon and germanium to react with the metal where contacted. After the reaction, a layer of metal silicide 54 is formed between the remaining portion of epitaxy layer 36 and the metal layer. The un-reacted metal layer is selectively removed through the use of an etchant that attacks metal but does not attack the germano-silicide.

Figure 9:
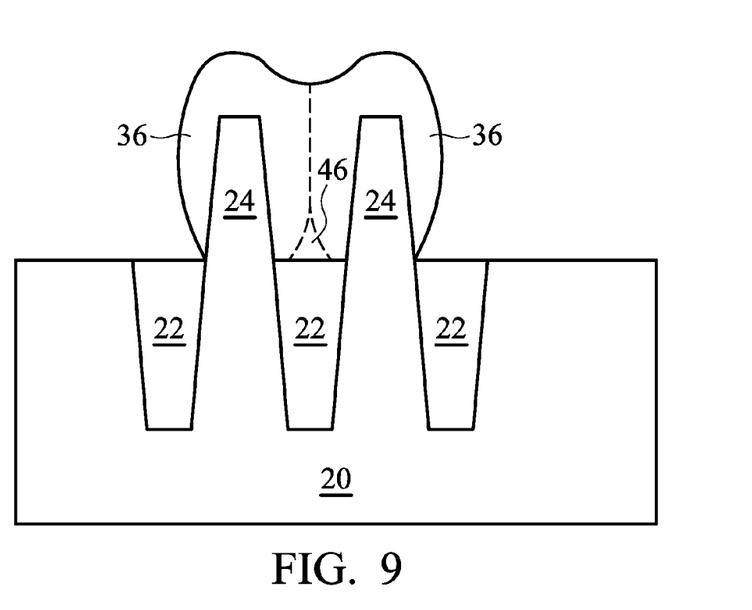
FIG. 9 illustrates the merging of two epitaxy layers growing from neighboring semiconductor fins.

FIG. 8 illustrates the formation of a single-fin FinFET, wherein epitaxy layer 36 grown from one fin 24 does not merge with the epitaxy layer grown from other fins. FIG. 9 illustrates that epitaxy layers 36 grown from neighboring fins 24 merge with each other to form a single epitaxy region. It is observed that due to the deposition-etch process, void 46 (if formed at all) caused by the merging of epitaxy layers 36 will be at least reduced, and possibly be eliminated. In addition, since defects are more likely to be generated from <111> surface planes, by etching back epitaxy layer 36, the sizes of the <111> surface planes are reduced, resulting in the decrease in the defect density.

FIG. 8 further illustrates the radius R1, R2, R3, and R4 of the ellipse shape. For example, from center 56 of the ellipse shape of the outer surface of epitaxy region 36, horizontal radius R1 and R2 may be drawn, wherein R1 and R2 extend in opposite horizontal directions from center 56, and are equal to each other. From center 56 of the ellipse shape of the outer surface of epitaxy region 36, vertical radius R3 and R4 may also be drawn, wherein radius R3 and R4 extend in opposite vertical directions from center 56, and are equal to each other. Furthermore, vertical radius R3 and R4 are greater than horizontal radius R1 and R2.

Although the embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   insulation regions; and
   a fin field-effect transistor (FinFET) comprising:
      a semiconductor fin over and adjacent to the insulation regions, wherein a maximum width of a top portion of the semiconductor fin is smaller than a maximum width of a bottom portion of the semiconductor fin;
      a gate dielectric over and contacting a top surface of a middle portion of the semiconductor fin, wherein the gate dielectric further contacts sidewalls of the middle portion of the semiconductor fin;
      a gate electrode on the gate dielectric; and
      a source/drain region over the insulation regions, wherein the source/drain region comprises:
         an end portion of the semiconductor fin, wherein both the middle portion of the semiconductor fin and the end portion of the semiconductor fin comprise silicon and are substantially free from germanium;
         an epitaxy layer on a top surface of the end portion of the semiconductor fin, wherein the epitaxy layer extends on sidewalls of the end portion of the semiconductor fin, wherein an outer surface of the epitaxy layer has an ellipse shape, and from a center of the ellipse shape, horizontal radius measured in opposite horizontal directions are equal to each other, and vertical radius measured in opposite vertical directions are equal to each other, and the vertical radius are greater than the horizontal radius; and
         a source/drain silicide region on the epitaxy layer, wherein the source/drain silicide region has an inner sidewall surface in contact with one of the sidewalls of the end portion of the semiconductor fin.

2. The integrated circuit structure of claim 1, wherein the epitaxy layer and the end portion of the semiconductor fin are formed of a same semiconductor material.

3. The integrated circuit structure of claim 1, wherein the epitaxy layer and the end portion of the semiconductor fin are formed of different semiconductor materials.

4. The integrated circuit structure of claim 1, wherein in a cross-sectional view of the semiconductor fin, a bottom corner of the source/drain silicide region contacts a joint, with the joint being formed of the one of the sidewalls of the end portion of the semiconductor fin and a top surface of the insulation regions.

5. The integrated circuit structure of claim 1, wherein the middle portion of the semiconductor fin and the end portion of the semiconductor fin have a same width.

6. The integrated circuit structure of claim 1, wherein the sidewalls of the middle portion of the semiconductor fin are substantially straight.

7. The integrated circuit structure of claim 1, wherein the source/drain silicide region has an outer surface, with the outer surface of the source/drain silicide region having the ellipse shape.

8. An integrated circuit structure comprising:
   a Shallow Trench Isolation (STI) region;
   a semiconductor fin comprising a middle portion and an extension, with the middle portion of the semiconductor fin having a first width, and the extension of the semiconductor fin having a second width equal to the first width, wherein the first width and the second width are measured at a same level, and wherein a maximum width of a top portion of the extension of the semiconductor fin is smaller than a maximum width of a bottom portion of the extension of the semiconductor fin;
   a gate dielectric contacting a top surface of the middle portion of the semiconductor fin and a sidewall of the middle portion of the semiconductor fin;
   a gate electrode over the gate dielectric;
   an epitaxy layer on a top surface of the extension of the semiconductor fin, wherein the epitaxy layer is further on sidewalls of the extension of the semiconductor fin, wherein an outer surface of the epitaxy layer has an ellipse shape, and from a center of the ellipse shape, horizontal radius measured in opposite horizontal directions are equal to each other, and vertical radius measured in opposite vertical directions are equal to each other, and the vertical radius are greater than the horizontal radius; and
   a source/drain silicide region on the epitaxy layer, wherein the source/drain silicide region has a bottom end joined to a joint of one of the sidewalls of the extension of the semiconductor fin and a top surface of the STI region.

9. The integrated circuit structure of claim 8, wherein the epitaxy layer and the extension of the semiconductor fin are formed of different materials.

10. The integrated circuit structure of claim 8, wherein the middle portion of the semiconductor fin comprises silicon and is free from germanium, with the gate dielectric contacting the middle portion of the semiconductor fin, wherein the epitaxy layer comprises silicon germanium.

11. The integrated circuit structure of claim 8, wherein the outer surface of the epitaxy layer has the ellipse shape.

12. The integrated circuit structure of claim 8, wherein an interface between the epitaxy layer and the source/drain silicide region is rounded.

13. An integrated circuit structure comprising:
a semiconductor fin, wherein a maximum width of a top portion of the semiconductor fin is smaller than a maximum width of a bottom portion of the semiconductor fin;
an isolation region on a side of the semiconductor fin, wherein the semiconductor fin protrudes over a top surface of the isolation region, with the semiconductor fin comprising:
a top surface; and
a sidewall connected to the top surface of the semiconductor fin, and the top surface of the semiconductor fin is substantially flat, and the sidewall of the semiconductor fin is substantially straight;
an epitaxy layer with inner surfaces contacting the top surface and the sidewall of the semiconductor fin, wherein the epitaxy layer comprises an outer surface having an ellipse shape, and from a center of the ellipse shape, horizontal radius measured in opposite horizontal directions are equal to each other, and vertical radius measured in opposite vertical directions are equal to each other, and the vertical radius are greater than the horizontal radius; and
a source/drain silicide region on the epitaxy layer, wherein the source/drain silicide region has a bottom end joined to a joint of the sidewall of the semiconductor fin and a top surface of the isolation region.

14. The integrated circuit structure of claim 13, further comprising:
a gate dielectric contacting the sidewall of the semiconductor fin; and
a gate electrode over the gate dielectric.

15. The integrated circuit structure of claim 8, wherein the source/drain silicide region has an inner sidewall contacting the one of the sidewalls of the extension of the semiconductor fin.

16. The integrated circuit structure of claim 8, wherein in a cross-sectional view of the source/drain silicide region, the source/drain silicide region does not form any substantially planar interface with the STI region.

17. The integrated circuit structure of claim 13, wherein the source/drain silicide region has an inner sidewall contacting the sidewall of the semiconductor fin.

* * * * *